(12) United States Patent
Wayburn et al.

(10) Patent No.: US 7,100,389 B1
(45) Date of Patent: *Sep. 5, 2006

(54) APPARATUS AND METHOD HAVING MECHANICAL ISOLATION ARRANGEMENT FOR CONTROLLING THE TEMPERATURE OF AN ELECTRONIC DEVICE UNDER TEST

(75) Inventors: Lewis S. Wayburn, Irmo, SC (US); Ian G. Spearing, Lexington, SC (US); Charles R. Schmidt, Jr., Lexington, SC (US)

(73) Assignee: Delta Design, Inc., Poway, CA (US)

( * ) Notice: Subject to any disclaimer, the term of this patent is extended or adjusted under 35 U.S.C. 154(b) by 224 days.

This patent is subject to a terminal disclaimer.

(21) Appl. No.: 10/196,354

(22) Filed: Jul. 16, 2002

(51) Int. Cl.
*F25D 23/12* (2006.01)

(52) U.S. Cl. ..................... 62/259.2; 324/760

(58) Field of Classification Search ............... 62/259.2, 62/295, 223; 324/750, 760, 765; 165/80.4, 165/80.7, 81, 82, 83, 104.33; 361/699–703
See application file for complete search history.

(56) References Cited

U.S. PATENT DOCUMENTS

| | | | |
|---|---|---|---|
| 4,138,692 A | | 2/1979 | Meeker et al. |
| 4,246,959 A | * | 1/1981 | Byrne ......................... 165/83 |
| 4,561,040 A | | 12/1985 | Eastman et al. |
| 4,740,866 A | | 4/1988 | Kajiwara et al. |
| 4,759,403 A | * | 7/1988 | Flint et al. .................. 165/80.4 |
| 4,777,561 A | * | 10/1988 | Murphy et al. ............. 361/700 |
| 4,789,023 A | * | 12/1988 | Grant ..................... 165/104.26 |
| 4,909,313 A | * | 3/1990 | Voss et al. ...................... 165/78 |
| 4,920,574 A | | 4/1990 | Yamamoto et al. |
| 4,951,740 A | | 8/1990 | Peterson et al. |
| 5,164,661 A | | 11/1992 | Jones |
| 5,196,785 A | | 3/1993 | Douglas |
| 5,198,753 A | | 3/1993 | Hamburgen |
| 5,206,791 A | * | 4/1993 | Novotny ...................... 361/700 |
| 5,325,052 A | | 6/1994 | Yamashita |
| 5,463,872 A | * | 11/1995 | Vader et al. .................. 62/51.1 |
| 5,735,339 A | * | 4/1998 | Davenport et al. ........ 165/80.1 |
| 5,778,969 A | * | 7/1998 | Kyung et al. .............. 165/80.1 |
| 5,847,293 A | | 12/1998 | Jones |
| 5,847,366 A | | 12/1998 | Grunfeld |
| 5,944,093 A | | 8/1999 | Viswanath |
| 5,977,785 A | | 11/1999 | Burward-Hoy |
| 6,049,217 A | | 4/2000 | Viswanath et al. |
| 6,058,010 A | * | 5/2000 | Schmidt et al. ............. 361/689 |
| 6,084,215 A | | 7/2000 | Furuya et al. |
| 6,104,204 A | | 8/2000 | Hayama et al. |

(Continued)

OTHER PUBLICATIONS

International Search Report on corresponding PCT application, Serial No. PCT/US03/21802, international filing date Jul. 11, 2003.

*Primary Examiner*—William Doerrler
*Assistant Examiner*—Michael J. Early
(74) *Attorney, Agent, or Firm*—Foley & Lardner LLP

(57) ABSTRACT

An apparatus and method for controlling the temperature of an electronic device under test utilizes a thermal head spaced apart from a movable support structure by a mechanical isolation assembly. The support structure has a manifold configured to route refrigerant fluid between the evaporator head and components of a refrigeration system. The mechanical isolation assembly is configured to compensate for variations in the planar orientation of the device under test. Moreover, the mechanical isolation assembly preferably includes bellows through which the refrigerant fluid is conducted.

38 Claims, 10 Drawing Sheets

U.S. PATENT DOCUMENTS

| | | |
|---|---|---|
| 6,147,506 A | 11/2000 | Ahmad et al. |
| 6,163,163 A | 12/2000 | Kohn et al. |
| 6,173,760 B1 | 1/2001 | Gardell et al. |
| 6,184,504 B1 | 2/2001 | Cardella |
| 6,262,584 B1 | 7/2001 | Kurosu et al. |
| 6,297,660 B1 | 10/2001 | Farnworth et al. |
| 6,392,431 B1 * | 5/2002 | Jones .......................... 324/760 |
| 6,424,141 B1 * | 7/2002 | Hollman et al. .......... 324/158.1 |
| 6,543,246 B1 * | 4/2003 | Wayburn et al. ............ 62/259.2 |
| 6,545,458 B1 * | 4/2003 | Yamazaki ................. 324/158.1 |
| 6,552,901 B1 * | 4/2003 | Hildebrandt ................ 361/700 |

* cited by examiner

APPARATUS AND METHOD HAVING MECHANICAL ISOLATION ARRANGEMENT FOR CONTROLLING THE TEMPERATURE OF AN ELECTRONIC DEVICE UNDER TEST

BACKGROUND OF THE INVENTION

The present invention generally relates to temperature control systems for maintaining the temperature of an electronic device at a predetermined temperature while the device is being tested.

Testing equipment has been utilized in the electronics industry to test the operation of an electronic device under test (DUT) such as an integrated circuit. Often, the testing equipment will include a thermal head having a temperature controlled surface which is brought into thermal engagement with a top surface of the DUT. The thermal head functions to maintain a predetermined temperature during the testing operation.

The integrated circuit is typically mounted to a carrier substrate having a plurality of depending pins, pads or other such contacts. The contacts are mated with corresonding contacts of a test fixture. As a result, the test fixture will be electrically connected to the DUT so that the testing operation can be performed.

Ideally, the DUT will be installed in the test fixture such that its top surface is exactly horizontal. In a real manufacturing environment, however, such is not always the case. For example, the top surface of the DUT may be slightly canted with respect to the horizontal after installation in the test fixture. This can cause poor electrical connection between at least some of the respective contacts. In addition, the temperature controlled surface of the thermal head (which is horizontal) may not fully engage the top surface of the DUT. As a result, heat transfer between the thermal head and the DUT will suffer.

SUMMARY OF THE INVENTION

In one aspect, the present invention provides an apparatus for controlling the temperature of an electronic device under test. The apparatus comprises a refrigeration system including a compressor and a condenser. The refrigeration system is operative to circulate a refrigerant fluid through a fluid flow loop such that the refrigerant fluid will change between gaseous and liquid states to alternately absorb and release thermal energy. An evaporator head is connected into the fluid flow loop and has a temperature controlled surface.

The apparatus further includes a support structure in spaced apart relation to the evaporator head. The support structure has a manifold configured to route the refrigerant fluid between the evaporator head and components of the refrigeration system. A mechanical isolation assembly is situated between the evaporator head and the support structure so as to compensate for variations in the planar orientation of the device under test. The mechanical isolation assembly includes an inflow bellows providing inflow of the refrigerant fluid into the evaporator head from the support structure. An outflow bellows provides outflow of the refrigerant fluid from the evaporator head to the support structure.

In some exemplary embodiments, the inflow bellows and the outflow bellows are coaxial to one another. For example, the inflow bellows may be located coaxially inside of the outflow bellows. The mechanical isolation assembly may further include an outer bellows in which the inflow and outflow bellows are located.

In other embodiments, the inflow and outflow bellows may be located side by side to one another. Often, it will be desirable in such embodiments to provide a third bellows substantially equidistant from the inflow bellows and outflow bellows. Again, the mechanical isolation assembly may also include an outer bellows in which the inflow and outflow bellows are located.

Preferably, the support structure may be movable between a retracted position farther from the device under test and an extended position closer to the device under test. In such embodiments, the support structure may include a substrate engaging member configured to engage a substrate to which the device under test is mounted when the support structure is in the extended position. The substrate engaging member will thus facilitate electrical contact between the device under test and a text fixture.

Embodiments are also contemplated in which the mechanical isolation assembly further includes a controllable mechanism operative to selectively vary an engagement force between the evaporator head and the device-under test. Preferably, the controllable mechanism may be actuated via a source of pressurized gas. In some embodiments, the mechanical isolation assembly may include a pivotal separation element extending between the thermal head and the support structure.

In other aspects, the present invention provides an apparatus for controlling the temperature of an electronic device under test. The apparatus comprises a refrigeration system including a compressor and a condenser. The refrigeration system is operative to circulate a refrigerant fluid through a fluid flow loop such that the refrigerant fluid will change between gaseous and liquid states to alternately absorb and release thermal energy. An evaporator head is connected into the fluid flow loop and has a temperature controlled surface.

The apparatus further includes a support structure in spaced apart relation to the evaporator. The support structure is movable between a retracted position farther from the device under test and an extended position closer to the device under test. A mechanical isolation assembly includes a controllable bellows situated between the support structure and the evaporator head. The controllable bellows is in fluid communication with a source of pressurized gas so as to selectively vary an engagement force between the thermal head and the device under test.

In some exemplary embodiments, the mechanical isolation assembly further includes an outflow bellows providing outflow of refrigerant fluid from the evaporator head to the support structure. Often, the mechanical isolation assembly may further include an inflow bellows providing inflow of refrigerant fluid into the evaporator head. In some such embodiments, the controllable bellows, the inflow bellows and the outflow bellows may be substantially equidistant from one another. Alternatively, the mechanical isolation assembly may include a coiled capillary tube providing inflow of refrigerant fluid into the evaporator head.

The apparatus of the present invention may further include an extension limiting mechanism to inhibit overextension of the mechanical isolation assembly. For example, the extension limiting mechanism may comprise first and second interlocking elements.

Still further aspects of the present invention are provided by an apparatus comprising a thermal head defining a passage for flow of refrigerant fluid therethrough. The thermal head has a temperature controlled surface for engagement with an electronic device. A support structure in spaced apart relation to the thermal head is also provided. The support structure has a manifold configured to route the refrigerant fluid.

The apparatus further includes a mechanical isolation assembly situated between the thermal head and the support structure so as to compensate for variations in the planar orientation of the electronic device. The mechanical isolation assembly includes an inflow bellows and an outflow bellows. The inflow bellows provides inflow of refrigerant fluid into the thermal head from the support structure. The outflow bellows provides outflow of refrigerant fluid from the thermal head to the support structure. In this aspect, the mechanical isolation assembly further includes a controllable mechanism operative to selectively vary an engagement force between the thermal head and the electronic device.

Preferably, the controllable mechanism is actuated via a source of pressurized gas. In this regard, the controllable mechanism may comprise a controllable bellows.

Other aspects of the present invention are achieved by a method of engaging an electronic device to be tested with a thermal head at a selected force. One step of the method involves providing an arrangement wherein the thermal head is separated from a support structure by an intervening mechanical isolation assembly. The mechanical isolation assembly includes a controllable bellows. Another step of the method involves moving the support structure from a retracted position farther from the electronic device to an extended position closer to the electronic device. According to a further step, pressurized gas is introduced into the controllable bellows so as to cause the thermal head to engage the electronic device with the selected force.

Still further aspects of the present invention are achieved by an apparatus comprising a thermal head defining a passage for flow of refrigerant fluid therethrough. The thermal head has a temperature controlled surface for engagement with an electronic device. A support structure in spaced apart relation to said thermal head is also provided. The support structure has a manifold configured to route the refrigerant fluid.

The apparatus further includes a mechanical isolation assembly including an inflow bellows and an outflow bellows. The inflow bellows provides inflow of refrigerant fluid into the thermal head from the support structure. The outflow bellows provides outflow of refrigerant fluid from the thermal head to the support structure. In addition, the mechanical isolation assembly includes a separation element extending between the thermal head and the support structure. The separation element is pivotal so as to allow variations in a planar orientation of the temperature controlled surface.

In some exemplary embodiments, the separation element comprises a post having a first end fixed to the thermal head and a second end pivotally engaging the support structure. Often, the second end of the post will be equipped with a dome portion. For example, the dome portion may slidably engage a spherical surface of the support structure. In this regard, the dome portion and the spherical surface may be coated with a low friction material. In addition, the post may be hollow.

Other objects, features and aspects of the present invention are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
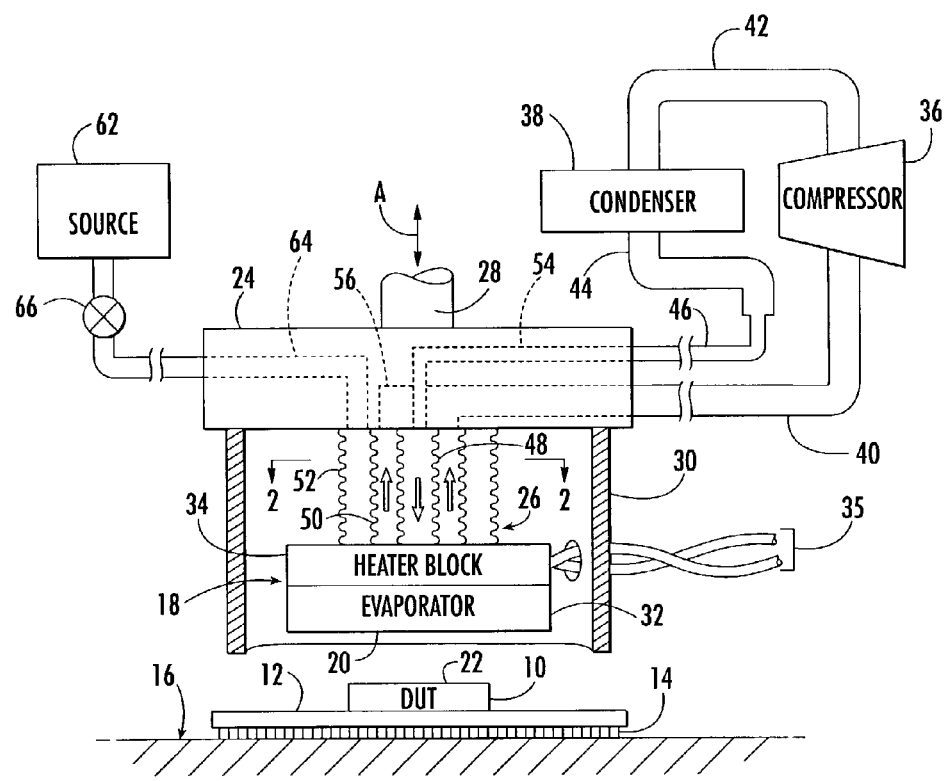
FIG. 1 is a diagrammatic representation of an apparatus constructed in accordance with the present invention for controlling the temperature of an electronic device under test.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only and is not intended as limiting the broader aspects of the present invention, which broader aspects are embodied in the exemplary constructions.

FIG. 1 illustrates an apparatus for controlling the temperature of an electronic device 10 under test ("DUT"). In this case, device 10 is an integrated circuit device mounted to a carrier substrate 12. Substrate 12 includes a plurality of contact pins 14 received in corresponding sockets of the test fixture (indicated generally at 16) so as to provide electrical connection between the test fixture and device 10. As one skilled in the art will appreciate, test fixture 16 supplies energy to power device 10, and initiates the various read/write commands by which the performance of device 10 is evaluated.

A thermal head 18 has a temperature controlled surface 20 which is moved into thermal engagement with the top surface 22 of device 10. As will be described more fully below, thermal head 18 is spaced apart from a support structure 24 by a mechanical isolation assembly 26. Support structure 24 is preferably fixed to the end of a movable rod 28 or other suitable mechanism which operates to move thermal head 18 (as indicated by arrow A) between an extended position adjacent to device 10 and a retracted position more remote from device 10. For example, rod 28 may form the piston rod of a pneumatic cylinder which is actuated to position thermal head 18 adjacent the device to be tested.

In this case, support structure 24 includes a substrate engaging member 30 which comes into contact with substrate 12 as thermal head 18 is lowered. Although any suitable configuration could be used, member 30 is configured in this case as a rigid cylindrical enclosure in which thermal head 18 and isolation assembly 26 are located. Member 30 pushes pins 14 of substrate 12 deeper into their corresponding sockets, thus facilitating electrical contact between device 10 and test fixture 16.

It is contemplated that another, similar engaging member could be located outboard of engaging member 30. This auxiliary engaging member may come into direct contact with test fixture 16 so as to limit the downward movement of rod 28.

Thermal head 18 is preferably configured having both cooling and heating capability to accurately maintain a wide range of possible temperatures. In this case, for example, thermal head 18 has an evaporator portion 32 situated between temperature controlled surface 20 and a heater portion 34. Heater portion 34 includes one or more heating elements operative to supply thermal energy when the temperature of device 10 drops below the desired temperature. Electrical energy is supplied to the heating elements via wires indicated at 35.

In this case, evaporator portion 32 is part of a refrigeration system also including a compressor 36 and a condenser 38. The refrigeration system employs a refrigerant fluid circulated around a fluid flow loop so as to alternately absorb and release thermal energy. This occurs when the refrigerant fluid changes between gaseous and liquid states in accordance with the well-known refrigeration cycle. The particular refrigerant chosen for this purpose will depend on the specific requirements of the application.

In particular, the refrigerant fluid absorbs excess thermal energy at the location of device 10 when refrigerant fluid "evaporates" from a liquid state to a gaseous state. This evaporation occurs in a fluid flow channel defined in evaporator portion 32. The low pressure gas exiting thermal head 18 is then fed along outlet tube 40 to compressor 36. The resulting high pressure gas is fed to condenser 38 by tube 42, where accumulated thermal energy dissipates. As a result, the refrigerant fluid is condensed to liquid form.

High pressure liquid from condenser 38 is fed back toward thermal head 18 along inlet tube 44. In this embodiment, the inner diameter of tube 44 changes at a predetermined location so to form a capillary tube 46. Expansion occurs in this downstream portion of the loop so as to produce a desired temperature drop. This pressure drop results in a drop in temperature.

The manner in which refrigerant expansion occurs depends on the particular design. For example, expansion may occur across the combination of capillary tube 46 and the internal flow passages of support structure 24. In presently preferred embodiments, a controllable valve may be positioned between tube 44 and capillary tube 46 where expansion may also occur. Although the specific elements providing the desired expansion will vary, the refrigeration system can be thought of as having an "expansion device." Details regarding the controllable valve are described in application Ser. No. 09/871,526, now U.S. Pat. No. 6,668,570, incorporated herein by reference.

One skilled in the art will appreciate that a refrigeration system may be constructed comprising a thermal compressor plus liquid pump (i.e., a condenser at some temperature and therefore pressure below the saturation pressure of the vapor returning from the thermal head is connected to the return line). The vapor condenses in the condenser, then the liquid is pumped with an ordinary liquid pump to generate a pressure difference to help drive the delivery of the liquid to the thermal head. This could be depicted in FIG. 1 by replacing compressor 36 with a condenser and condenser 38 with a liquid pump. In situations where this arrangement can be used, significant energy savings over the arrangement shown in the drawing may be possible.

Also, a refrigeration effect can be achieved by warming the refrigerant, rather than just evaporating it. Generally, there are two effects for cooling: first, by change of state from liquid to gas (latent heating), and second, by warming the gas from some cooler temperature to some warmer temperature (sensible heating). Both effects may be employed in the thermal head, depending on thermal load conditions of the DUT, although from latent cooling one can get significantly higher cooling effect per unit of refrigerant circulated within some allowable temperature variation, which is one of the present invention's advantages.

It will be appreciated that outlet tube 40 and capillary tube 46 are attached to support structure 24 rather than thermal head 18 as has been typical in the past. In this regard, support structure 24 includes a manifold which routes the refrigerant fluid to and from appropriate locations. Mechanical isolation assembly 26 allows thermal head 18 to "float" with respect to support structure 24. In other words, mechanical isolation assembly 26 ensures co-planarity between thermal head 18 and device 10 despite some variation between the planar orientation of device 10 and support structure 24. This facilitates more effective thermal engagement (and thus heat transfer) between device 10 and thermal head 18.

Figure 2:
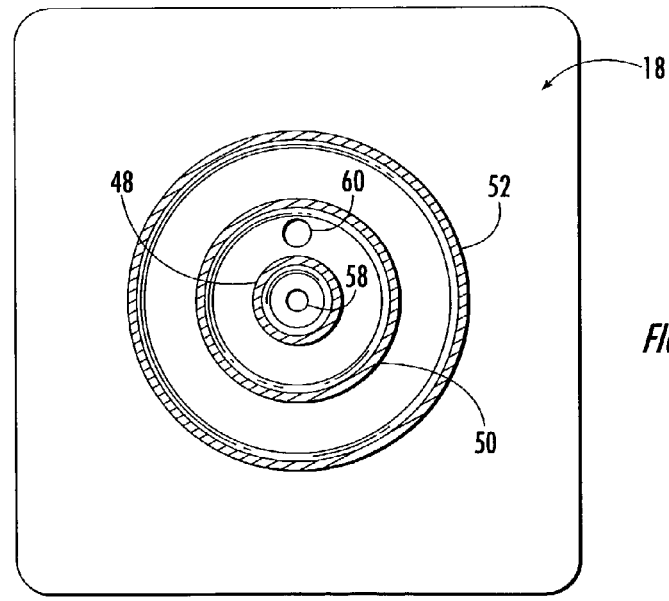
FIG. 2 is a cross-sectional view as taken along line 2—2 of FIG. 1.

Referring now also to FIG. 2, arrangement 26 is configured in this example having a total of three flexible bellows 48, 50 and 52 which are coaxial with each other. As shown, refrigerant fluid enters thermal head 18 through bellows 48 and exits through bellows 50. Toward this end, it will be appreciated that bellows 48 and 50 are in fluid communication with the appropriate flow passages 54 and 56 of support structure 24. The inlet and outlet to the evaporator itself are indicated at 58 and 60, respectively.

Assembly 26 may further include a controllable mechanism operative to provide a variable engagement force between device 10 and thermal head 18. This controllable mechanism may further operate to move thermal head 18 into final engagement with device 10 after support structure 24 has been moved to its adjacent extended position. In the illustrated embodiment, for example, the controllable mechanism functions by introducing pressurized air into the space between bellows 50 and 52. As one skilled in the art will appreciate, the pressurized air acts on the top surface of thermal head 18 in relation to the pressure of the gas.

Toward this end, the illustrated embodiment includes a source 62 of pressurized gas connected to support structure 24. Support structure 24 defines an associated passage 64 in fluid communication with bellows 52. A regulator and a valve 66 is provided to control the flow of pressurized gas to and from bellows 52. Preferably, the pressurized gas will be "dry" (i.e., without water vapor) to provide effective insulation. Dry air is also preferred so as to reduce problems with condensation.

Figure 3:
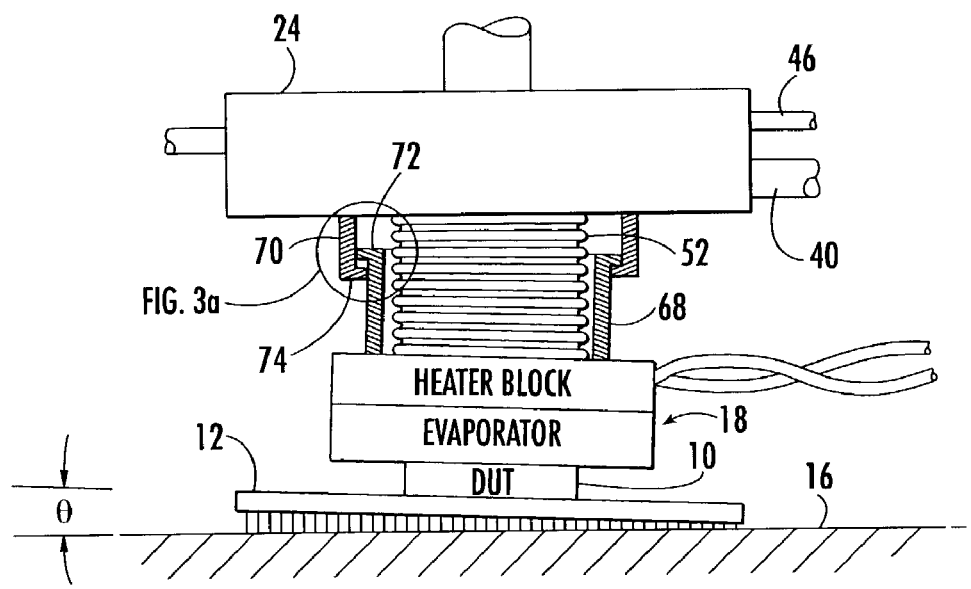
FIG. 3 is an enlarged diagrammatic representation illustrating the manner in which the mechanical isolation assembly compensates for variations in the planar orientation of the device under test.

In some cases, it may be desirable to provide an extension limiting mechanism to inhibit over-extension of mechanical isolation assembly 26. As illustrated in FIG. 3, one such mechanism includes a cylindrical first member 68 attached to the top of thermal head 18 and a cylindrical second member 70 attached to the bottom of support structure 24. Member 68 includes an outward flange 72 which engages inward flange 74 of member 70 so as to limit the extension of bellows 52. As one skilled in the art will recognize, such an arrangement may also advantageously prevent over-compression (by interference of the flange 74 with the thermal head 34 or flange 72 with the support structure 24).

Figure 3A:
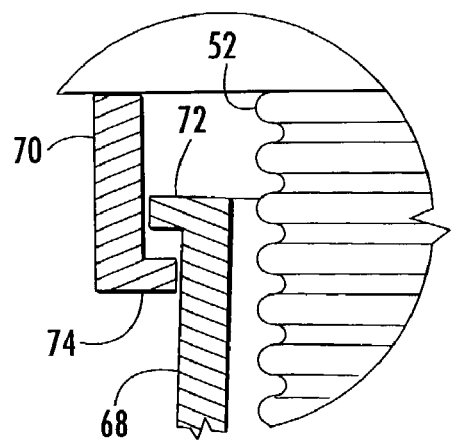
FIG. 3a is an enlarged view of the portion so indicated in FIG. 3 showing one preferred embodiment of an extension limiting mechanism.

Desirably, however, the extension limiting mechanism does not otherwise interfere with operation of the mechanical isolation assembly. In this case, for example, it can be seen that substrate 12 is inserted into test fixture 16 at a slight cant (indicated by the angle Theta). As can be seen most clearly in FIG. 3a, members 68 and 70 will move freely with respect to each other (within their range of movement) so as to achieve co-planarity between thermal head 18 and the top surface of device 10.

Figure 4:
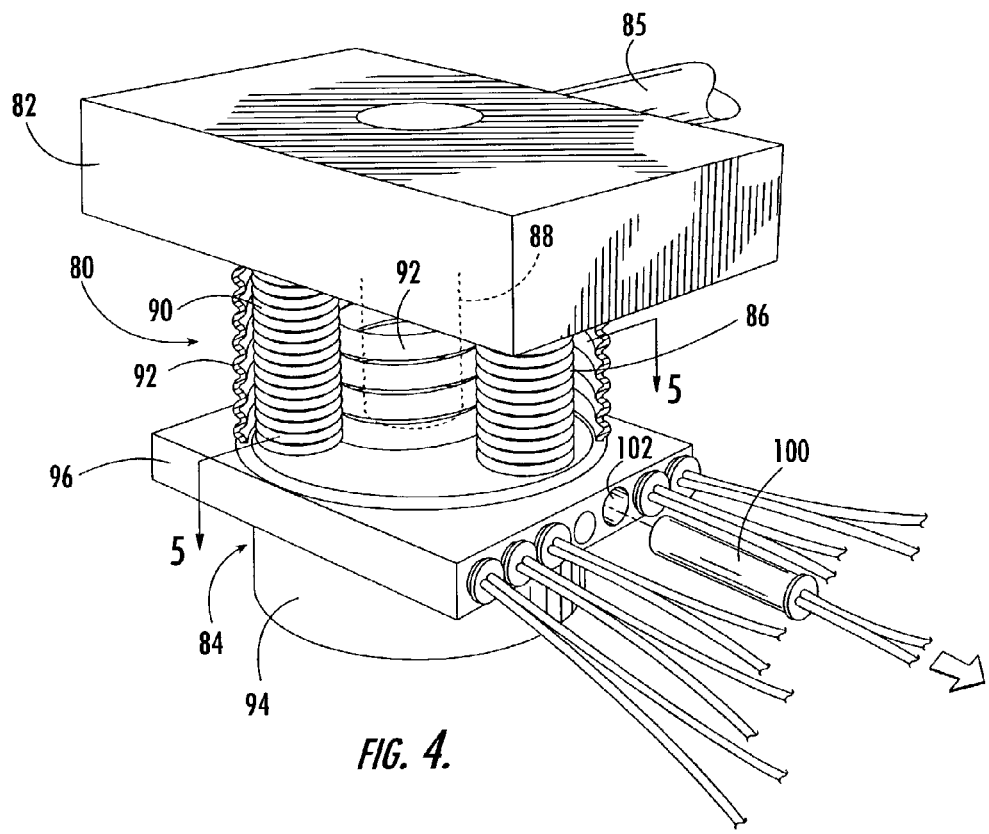
FIG. 4 is a perspective view of an alternative mechanical isolation assembly showing additional details.
Figure 5:
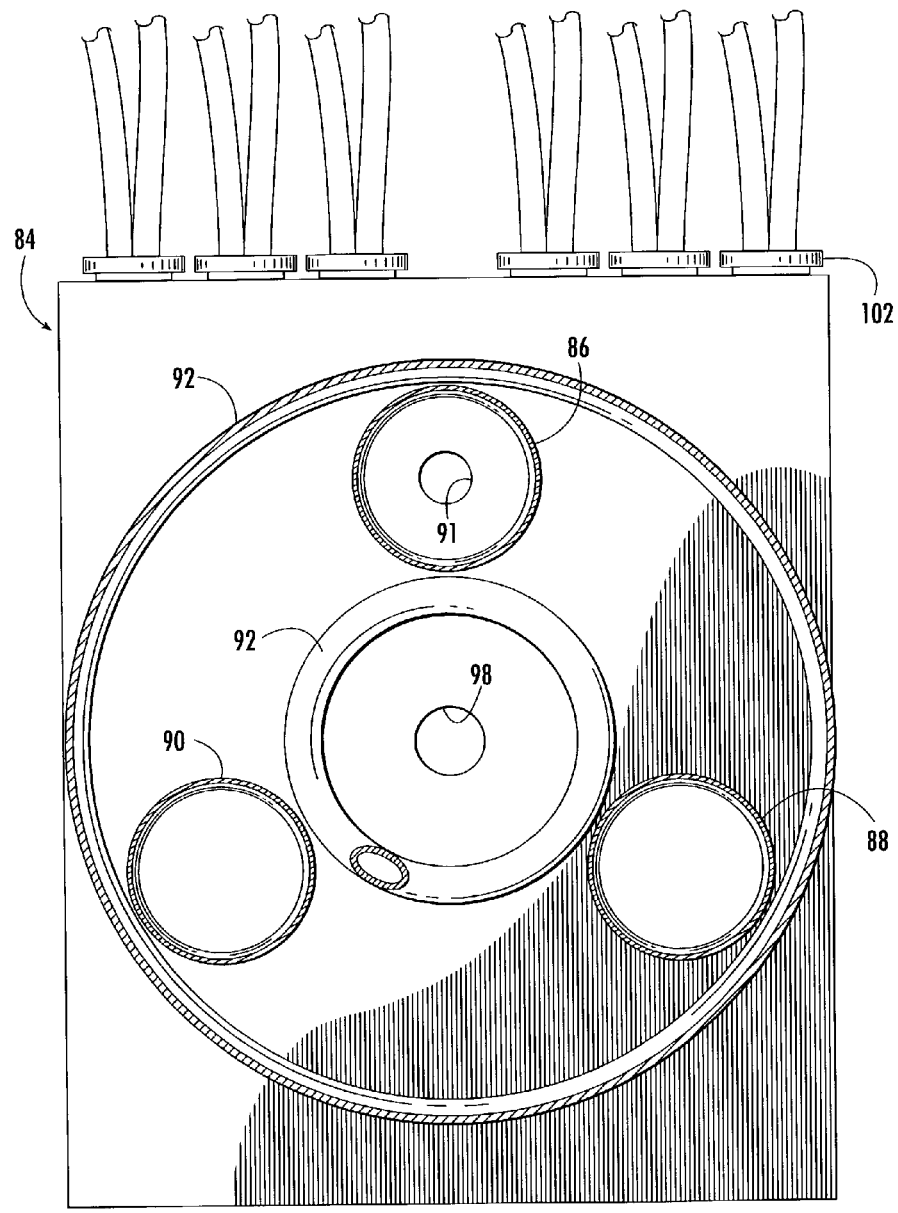
FIG. 5 is a cross-sectional view taken along line 5—5 of FIG. 4.

While the mechanical isolation assembly shown above utilizes coaxial bellows, it will be appreciated that various alternative arrangements may also be provided in accordance with the present invention. Referring now to FIGS. 4 and 5, an alternative mechanical isolation assembly 80 is situated between a support structure 82 and a thermal head 84. A portion of the refrigerant outlet tube extending from support structure 82 is indicated at 85.

As can be seen most clearly in FIG. 5, mechanical isolation assembly 80 includes three inner bellows 86, 88 and 90 spaced equidistant to one another. Refrigerant fluid exits thermal head 84 through an outlet 91 located in bellows 86, as shown. While the refrigerant inlet could be located in one of the other bellows, the illustrated arrangement utilizes a coiled capillary tube 92. Due to its coiled configuration, capillary tube 92 functions as a helical spring to provide a downward force at thermal head 84. In this case, either bellows 88 or 90 (or both) could also be used as a controllable bellows for slight movement of thermal head 84 in the manner described above. They could also be used as additional outlet ports (like 91) to reduce pressure drop in the return line. An outer bellows 92 contains the other bellows and thus serves as an encasement for the mechanical isolation assembly.

Certain details regarding the construction of thermal head 84 (which details are also applicable to various embodiments of the invention) will now be described. As can be seen, thermal head 84 includes an evaporator portion 94 integrated with a heater portion 96. Preferably, a thermocouple is located at the temperature controlled surface so as to measure the instantaneous temperature at the device under test. This information is fed back to a control system so that a predetermined temperature can be maintained. In this case, the thermocouple wires exit through a vertical hole 98 defined through the middle of thermal head 84. Although not illustrated, a central bellows could be provided in axial alignment with hole 98 to serve as a conduit for the thermocouple wires.

Preferably, heater portion 96 includes a plurality of individual heating elements for rapid and consistent application of heat (when necessary). For ease of manufacture and other factors, the illustrated embodiment uses a plurality of cartridge heaters (such as heater 100) for this purpose. The individual heaters are received in respective holes (such as hole 102) extending transversely through heater portion 96.

As one skilled in the art will appreciate, thermal head 84 is preferably made of materials which exhibit high thermal conductivity. At the same time, thermal head 84 is preferably configured to have low heat capacity in order to allow rapid transfer of thermal energy. In this regard, evaporator portion 94 and heater portion 96 may be formed of copper in some embodiments. The two pieces can be joined together such as by brazing to yield an integral structure.

Figure 6:
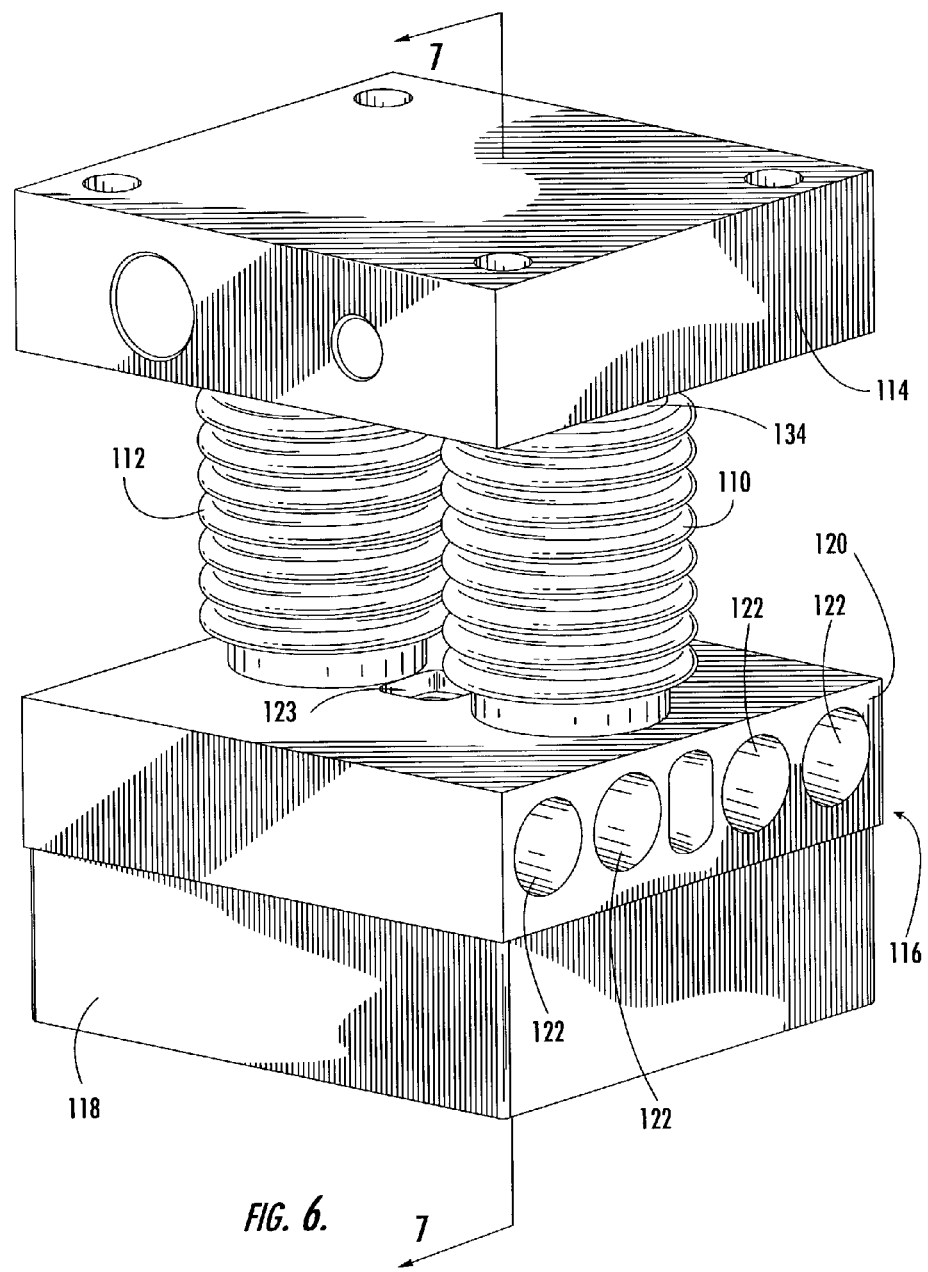
FIG. 6 is a perspective view of another alternative mechanical isolation assembly constructed in accordance with the present invention.
Figure 7:
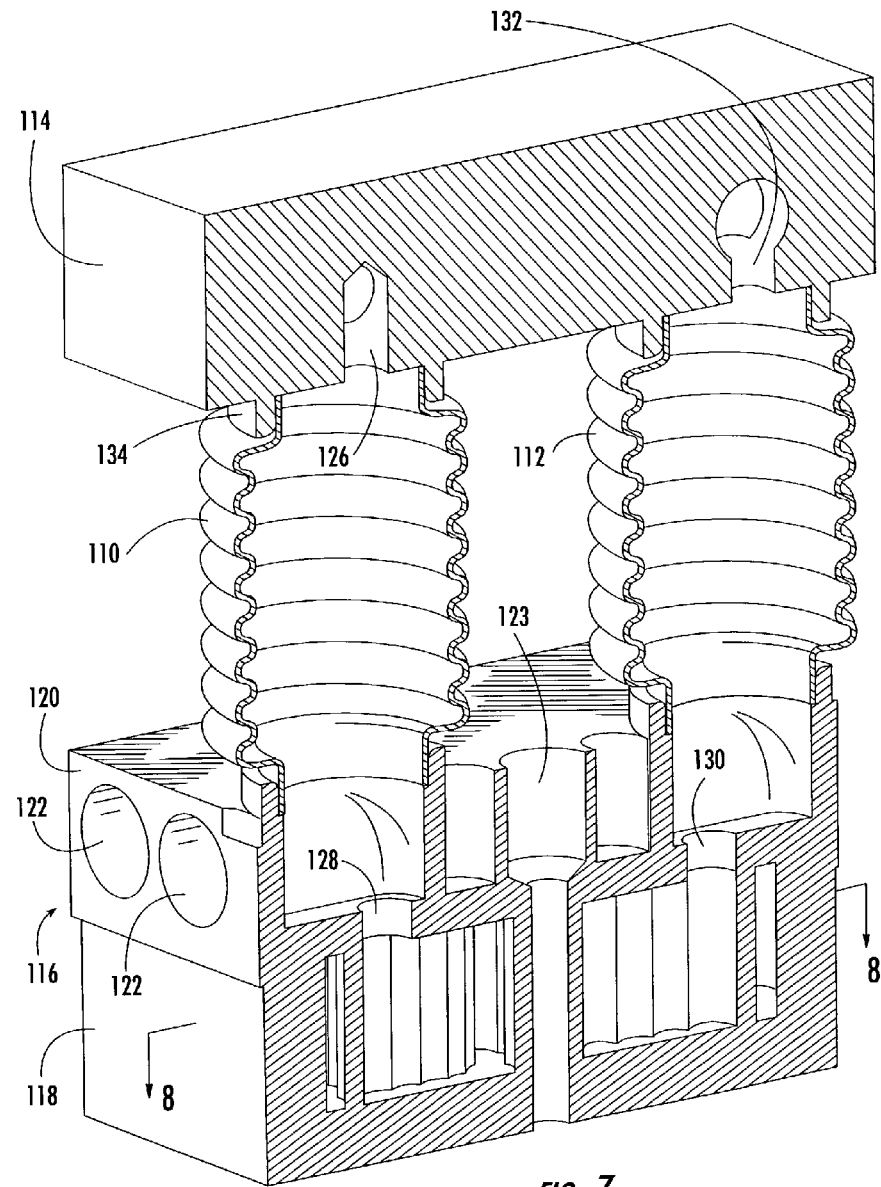
FIG. 7 is a cross-sectional view taken along line 7—7 of FIG. 6.

FIGS. 6 and 7 illustrate a further alternative in which the mechanical isolation assembly has a pair of side-by-side bellows 110 and 112 situated between a support structure 114 and a thermal head 116. Thermal head 116 includes an evaporator portion 118 and a heater portion 120, as shown. A plurality of transverse holes 122 extend through heater portion 120 for receipt of cartridge heaters. A thermocouple may be situated in a vertical hole 123 defined through the middle of thermal head 116.

Bellows 110 conducts refrigerant fluid between inlet port 126 of support structure 114 and fluid inlet 128 of evaporator portion 118. Similarly, bellows 112 conducts refrigerant fluid from fluid outlet 130 of evaporator portion 118 to outlet port 132 of support structure 114.

In this embodiment, the spring constant of the bellows themselves is selected to give the proper force upon the device under test, rather than separate pneumatic actuation. Toward this end, the bellows are preferably made of a material, such as a suitable metal, which provides resilience while maintaining an acceptable level of structural rigidity. Typical materials from which the bellows may be made include stainless steel, beryllium copper and phosphor bronze.

Preferably, the diameter of the bellows is selected to be small enough so that pressure fluctuations within the bellows have minimal impact on the overall force applied to the device under test, but large enough for mechanical stability and contact force. For example, many embodiments of the present invention may utilize bellows having a diameter of about 0.25 inches and a length of about 0.5 inches. In such embodiments, the bellows may together produce an engagement force at the "work height" of about 2–40 pounds. For example, a spring force of about 20 pounds may be especially desirable in some cases. (As one skilled in the art will appreciate, the spring force at the work height will be greater than at the free height because spring force will increase with deflection of the bellows.) Of course, the specific configuration of the bellows will depend on the exigencies of the particular application.

In the illustrated embodiment, each end of the bellows is first inserted into an outer lip (such as lip 134) located on the support structure or the thermal head. In some cases, it may be desirable to also provide an inner lip which is coaxial with the outer lip (thus forming an annular groove into which the end of the bellows is inserted). The end of the bellows may then be secured in this position by brazing or other suitable technique. As one skilled in the art will appreciate, the "socket" and the fabrication technology may change for various embodiments.

Figure 8:
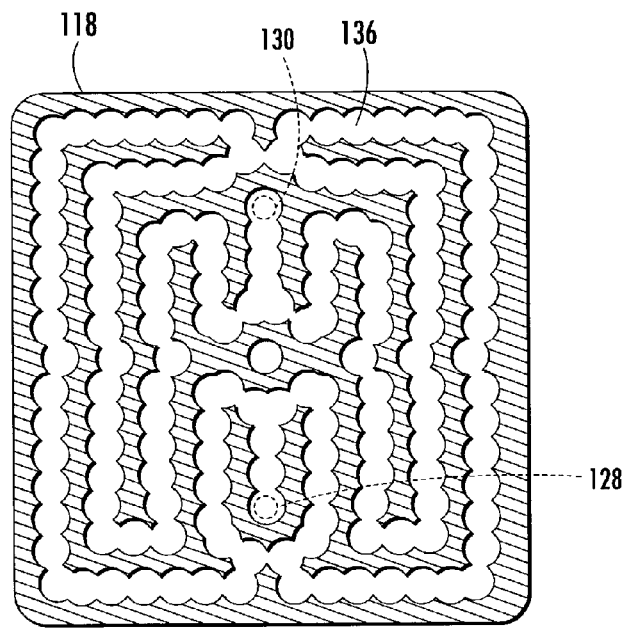
FIG. 8 is a cross-sectional view taken along line 8—8 of FIG. 7 showing details of an exemplary evaporator flow passage.

FIG. 8 illustrates an exemplary flow channel 136 which can be defined in evaporator portion 118. In this case, refrigerant fluid enters through inlet 128 and moves along the serpentine pattern of flow channel 136. Absorbed thermal energy causes the refrigerant to evaporate before exiting through outlet 130. As shown, flow channel 136 may be formed by plunge drilling a connected path.

Figure 9:
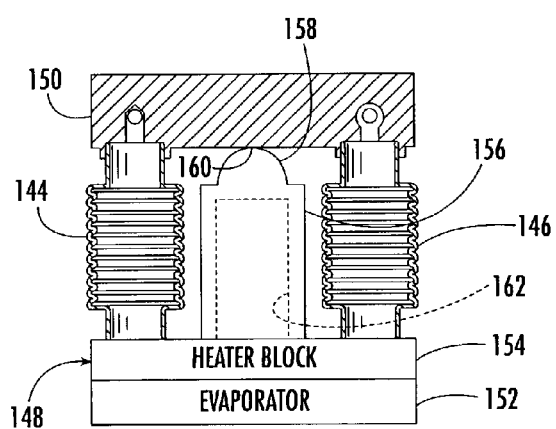
FIG. 9 is a diagrammatic representation of another alternative mechanical isolation assembly constructed in accordance with the present invention.

FIG. 9 illustrates an embodiment in which a mechanical isolation assembly includes a pair of side-by-side bellows 144 and 146 extending between a thermal head 148 and a support structure 150. In this case, thermal head 148 has both an evaporator portion 152 and a heater portion 154.

This embodiment includes a suitable separation element extending between thermal head 148 and support structure 150. In this case, for example, a rigid post 156 is attached to thermal head 148 so as to extend upward to support structure 150. A dome portion 158 contacts the underside of support structure 150 to form a pivot point 160. As a result, the planar orientation of thermal head 148 can vary with respect to support structure 150. In addition, a hollow cavity 162 may be defined in post 156 to contain components of the thermocouple extending through thermal head 148. Moreover, post 156 is fixed to thermal head 148 in this embodiment, but one skilled in the art will appreciate that a separation element could alternatively depend from support structure 150.

Figure 10:
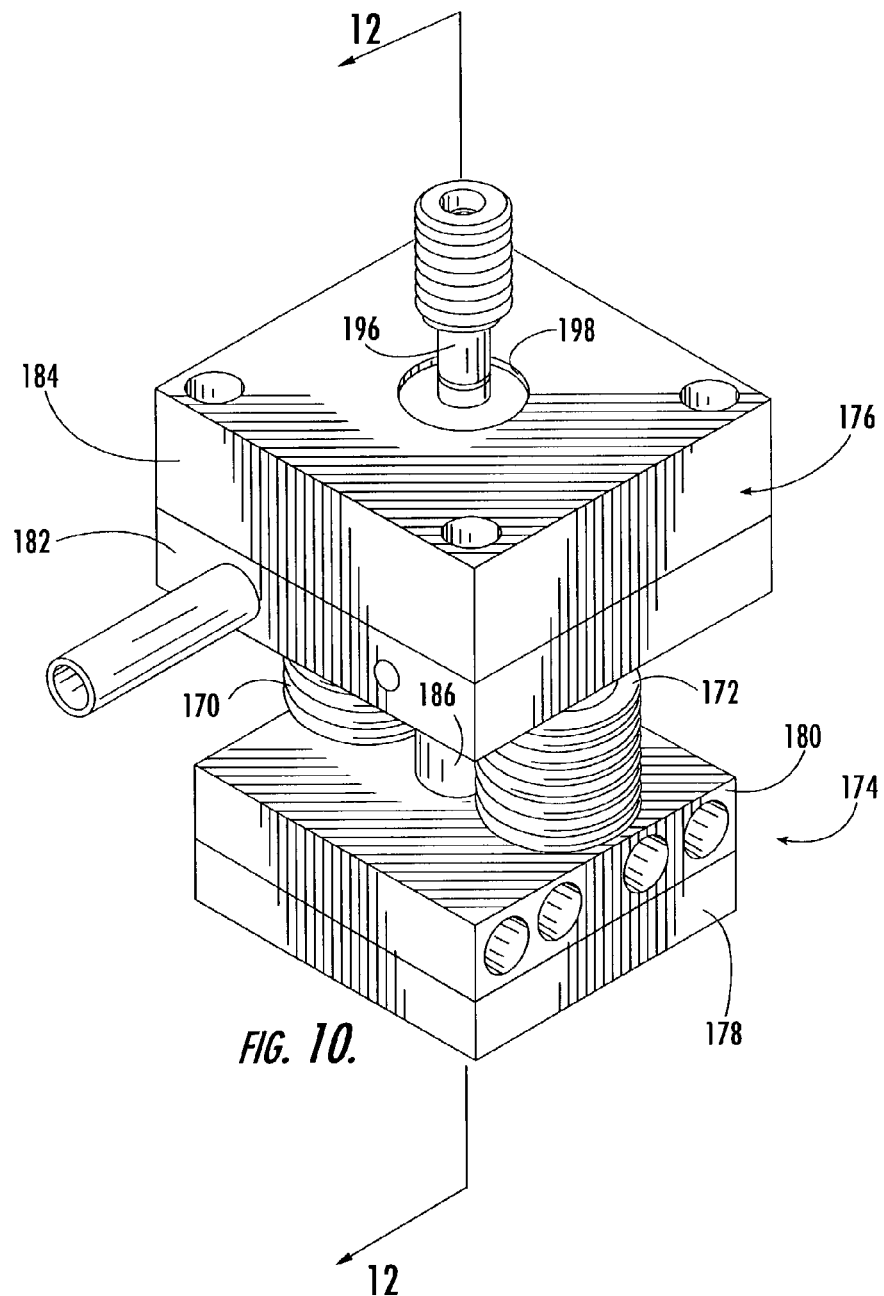
FIG. 10 is a perspective view of a still further alternative mechanical isolation assembly constructed in accordance with the present invention.
Figure 11:
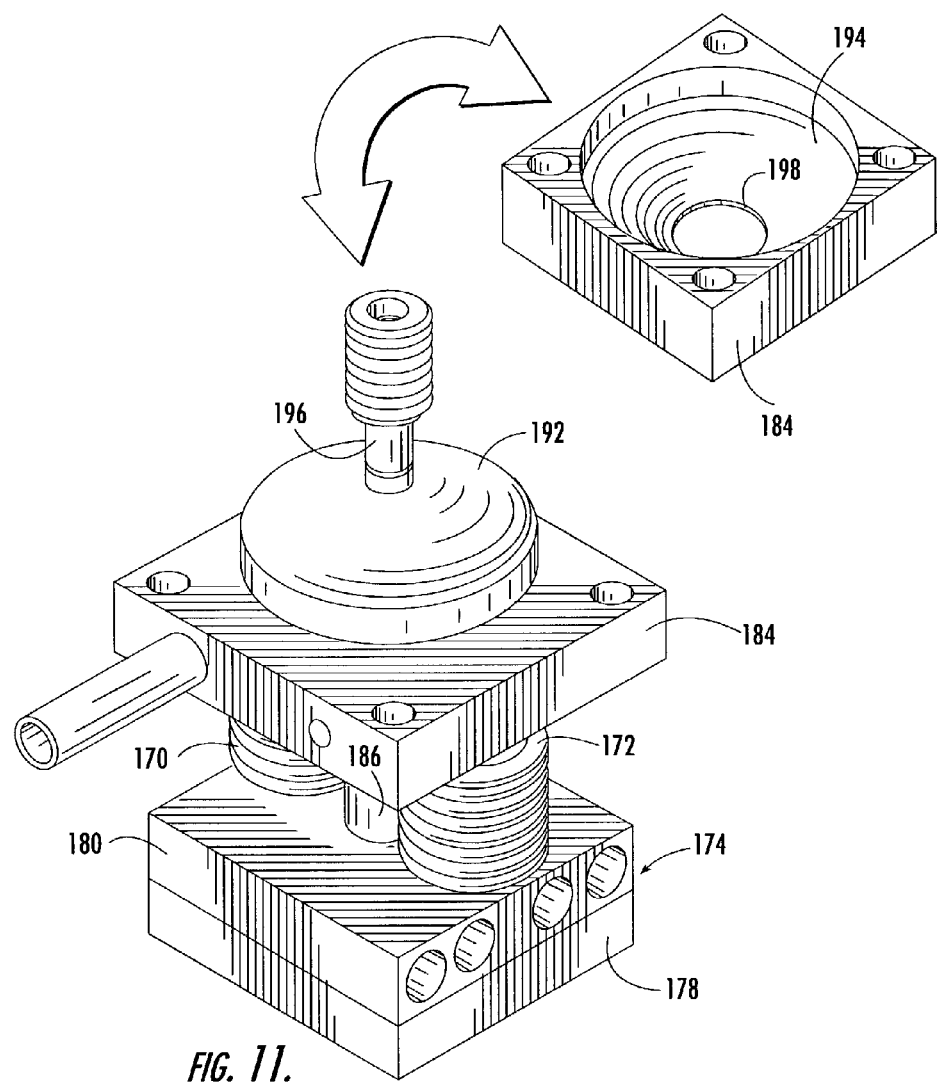
FIG. 11 is a view of the embodiment of FIG. 10 with the cap portion of the support structure removed.
Figure 12:
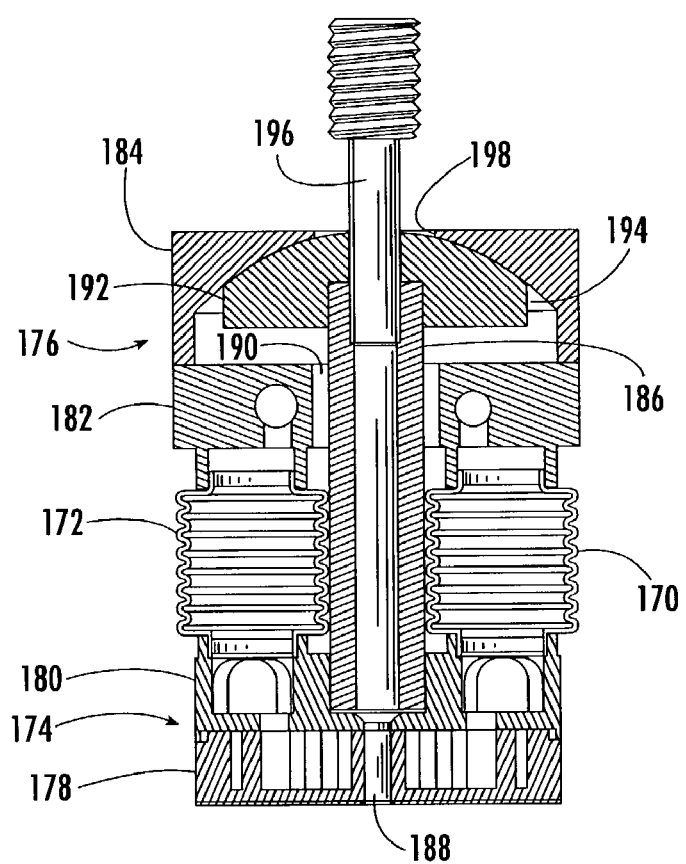
FIG. 12 is a cross-sectional view as taken along line 12—12 of FIG. 10.

A further alternative is illustrated in FIGS. 10–12, where the mechanical isolation assembly includes a pair of bellows 170 and 172. Bellows 170 and 172 extend between a thermal head 174 and a support structure 176. In this embodiment, thermal head 174 includes both an evaporator portion 178 and a heater portion 180. Support structure 176 includes here a bottom portion 182 and a removable top portion 184.

As can be most clearly seen in FIG. 12, a rigid post 186 extends upward from thermal head 174 in axial alignment with thermocouple hole 188. Bottom portion 182 of support structure 176 defines a hole 190 through which rigid post 186 freely extends. A dome portion 192 located at the top of rigid post 186 engages a spherical surface 194 defined on the underside of top portion 184. A chimney 196 extends upward from dome portion 192 through a hole 198 defined in the upper surface of top portion 184. The thermocouple wires will extend up through the hollow interior of rigid post 186 and chimney 196 in this embodiment.

It will be appreciated that the embodiment illustrated in FIGS. 10 through 12 functions in a manner similar to the embodiment of FIG. 9. Specifically, rigid post 186 ensures a fixed separation between thermal head 174 and support structure 176. Dome portion 192 and surface 194 allow the planar orientation of thermal head 174 to adjust as needed in a particular situation. One skilled in the art will appreciate that hole 198 should have a sufficient diameter to accommodate the entire angular range through rigid post 186 is expected to move. In addition, dome portion 192 and/or surface 194 can be coated with a suitable low friction material, such as Teflon®, in order to facilitate the desired pivotal movement.

It can be seen that the present invention provides apparatus and methods for maintaining an electronic device under test at a selected temperature. While preferred embodiments of the invention have been shown and described, modifications and variations may be made thereto by those of skill in the art without departing from the spirit and scope of the present invention. For example, the cooled portion of the thermal head is configured as an evaporator in the above-described embodiments. Embodiments are also contemplated, however, in which a chilled liquid is circulated through the thermal head. Moreover, the thermal head may or may not include heating capability (depending on the exigencies of a particular application). In addition, while cylindrical bellows have been shown above, one skilled in the art will appreciate that other configurations (such as square, rectangular or other shapes) could also be utilized as convenient. Those of ordinary skill in the art will also appreciate that the foregoing description is by way of example only, and is not intended to be limitative of the invention so further described in the appended claims.

What is claimed is:

1. An apparatus for controlling the temperature of an electronic device under test, said apparatus comprising:
   a refrigeration system including a compressor and a condenser, said refrigeration system being operative to circulate a refrigerant fluid will change between gaseous and liquid states to alternately absorb and release thermal energy;
   an evaporator head connected into said fluid flow loop, said evaporator head having a temperature controlled surface;
   a support structure in spaced apart relation to said evaporator head, said support structure having a manifold configured to route said refrigerant fluid between said evaporator head and components of said refrigeration system;
   a mechanical isolation assembly situated between said evaporator head and said support structure so as to compensate for variations in the planar orientation of said device under test; and
   said mechanical isolation assembly including an inflow bellows and an outflow bellows located side by side to one another, inflow bellows providing inflow of said refrigerant fluid from said evaporator head to said support structure.

2. An apparatus as set forth in claim 1, wherein said mechanical isolation assembly further comprises an outer bellows in which said inflow and outflow bellows are located.

3. An apparatus as set forth in claim 1, further comprising a third bellows substantially equidistant from said inflow bellows and said outflow bellows.

4. An apparatus as set forth in claim 3, wherein said mechanical isolation assembly further comprises an outer bellows in which said inflow and outflow bellows are located.

5. An apparatus as set forth in claim 1, wherein said support structure is movable between a retracted position farther from said device under test and an extended position closer to said device under test.

6. An apparatus as set forth in claim 5, wherein said support structure includes a substrate engaging member, said substrate engaging member configured to engage a substrate to which said device under test is mounted when said support structure is in said extended position so as to facilitate electrical contact between said device under test and a test fixture.

7. An apparatus as set forth in claim 1, wherein said mechanical isolation assembly further includes a controllable mechanism operative to selectively vary an engagement force between said evaporator head and said device under test.

8. An apparatus as set forth in claim 7, wherein said controllable mechanism is actuated via a source of pressurized gas.

9. An apparatus as set forth in claim 1, wherein said mechanical isolation assembly includes a pivotal separation element extending between said thermal head and said support structure.

10. An apparatus for controlling the temperature of an electronic device under test, said apparatus comprising:
    a refrigeration system including a compressor and a condenser, said refrigeration system being operative to circulate a refrigerant fluid through a fluid flow loop such that said refrigerant fluid will change between gaseous and liquid states to alternately absorb and release thermal energy;

an evaporator head connected into said fluid flow loop, said evaporator head having a temperature controlled surface;

a support structure in spaced apart relation to said evaporator head, said support structure being movable between a retracted position farther from said device under test and an extended position closer to said device under test;

a source of pressurized gas;

a mechanical isolation assembly including a controllable bellows situated between said support structure and said evaporator head, said controllable bellows being in fluid communication with said source of pressurized gas so as to selectively vary an engagement force between said evaporator head and said device under test.

11. An apparatus as set forth in claim 10, wherein said mechanical isolation assembly further includes an outflow bellows providing outflow of said refrigerant fluid from said evaporator head to said support structure.

12. An apparatus as set forth in claim 11, wherein said mechanical isolation assembly further includes an inflow bellows providing inflow of said refrigerant fluid into said evaporator head from said support structure.

13. An apparatus as set forth in claim 12, wherein said controllable bellows, said inflow bellows and said outflow bellows are substantially equidistant from one another.

14. An apparatus as set forth in claim 12, wherein said mechanical isolation assembly further comprises a capillary tube coiled between said support structure and said evaporator head, said capillary tube providing inflow of said refrigerant fluid into said evaporator head from said support structure.

15. An apparatus as set forth in claim 10, wherein further comprising an extension limiting mechanism to inhibit over-extension of said mechanical isolation assembly.

16. An apparatus as set forth in claim 15, wherein said extension limiting mechanism comprises first and second interlocking elements.

17. An apparatus comprising:

a thermal head defining a passage for flow of refrigerant fluid therethrough, said thermal head having a temperature controlled surface for engagement with an electronic device;

a support structure in spaced apart relation to said thermal head, said support structure having a manifold configured to route said refrigerant fluid;

a mechanical isolation assembly situated between said thermal head and said support structure so as to compensate for variations in the planar orientation of said electronic device;

said mechanical isolation assembly including an inflow bellows and an outflow bellows, said inflow bellows providing inflow of said refrigerant fluid into said thermal head from said support structure and said outflow bellows providing outflow of said refrigerant fluid from said thermal head to said support structure; and said mechanical isolation assembly further including a controllable mechanism operative to selectively vary an engagement force between said thermal head and said electronic device.

18. An apparatus as set forth in claim 17, wherein said controllable mechanism is actuated via a source of pressurized gas.

19. An apparatus as set forth in claim 18, wherein said controllable mechanism comprises a controllable bellows.

20. An apparatus as set forth in claim 19, wherein said inflow bellows and said outflow bellows are coaxial to one another.

21. An apparatus as set forth in claim 20, wherein said inflow bellows and said outflow bellows are located inside of said controllable bellows.

22. An apparatus as set forth in claim 21, further comprising an outer bellows in which said inflow bellows, said outflow bellows and said controllable bellows are located.

23. An apparatus as set forth in claim 19, wherein said inflow and outflow bellows are located side by side to one another.

24. An apparatus as set forth in claim 23, wherein said controllable bellows is located substantially equidistant from said inflow bellows and said outflow bellows.

25. An apparatus as set forth in claim 17, wherein said support structure is movable between a retracted position farther from said device under test and an extended position closer to said device under test.

26. An apparatus as set forth in claim 25, wherein said support structure includes a substrate engaging member, said substrate engaging member configured to engage a substrate to which said electronic device is mounted when said support structure is in said extended position so as to facilitate electrical contact between said electronic device and a text fixture.

27. An apparatus as set forth in claim 17, wherein further comprising an extension limiting mechanism to inhibit over-extension of said mechanism isolation assembly.

28. An apparatus as set forth in claim 27, wherein said extension limiting mechanism comprises first and second interlocking elements.

29. An apparatus as set forth in claim 17, wherein said thermal head further includes a heater operative to supply thermal energy to said temperature controlled surface when necessary to maintain said predetermined temperature.

30. A method of engaging an electronic device to be tested with a thermal head at a selected force, said method comprising steps of:

(a) providing an arrangement wherein said thermal head is separated from a support structure by an intervening mechanical isolation assembly, said mechanical isolation assembly having a controllable bellows;

(b) moving said support structure from a retracted position farther from said electronic device to an extended position closer to said electronic device; and (c) introducing pressurized gas into said controllable bellows so as to cause said thermal head to engage said electronic device with said selected force.

31. An apparatus for controlling the temperature of an electronic device under test, said apparatus comprising:

a thermal head defining a passage for flow of refrigerant fluid therethough, said thermal head having a temperature controlled surface for engagement with an electronic device;

a support structure in spaced apart relation to said thermal head, said support structure having a manifold configured to route said refrigerant fluid;

a mechanical isolation assembly including an inflow bellows and an outflow bellows, said inflow bellows providing inflow of said refrigerant fluid into said thermal head from said support structure and said outflow bellows providing outflow of said refrigerant fluid from said thermal head to said support structure; and said mechanical isolation assembly including a separation element extending between said thermal head and said support structure, said separation element being pivotal so as to allow variations in a planar orientation of said temperature controlled surface.

32. An apparatus as set forth in claim 31, wherein said separation element comprises a post having a first end fixed to said thermal head, said post further having a second end pivotally engaging said support structure.

33. An apparatus as set forth in claim 32, wherein said second end of said post includes a dome portion.

34. An apparatus as set forth in claim 33, wherein said dome portion slidably engages a spherical surface of said support structure.

35. An apparatus as set forth in claim 34, wherein said dome portion and said spherical surface are coated with a low friction material.

36. An apparatus as set forth in claim 32, wherein said post is hollow.

37. An apparatus as set forth in claim 31, wherein said support structure is movable between a retracted position farther from said device under test and an extended position closer to said device under test.

38. An apparatus as set forth in claim 31, further including a refrigeration system including a compressor and a condenser, said refrigeration system being operative to circulate a refrigerant fluid through a fluid flow loop such that said refrigerant fluid will change between gaseous and liquid states to alternately absorb and release thermal energy.

* * * * *